(12) United States Patent
Ahmed et al.

(10) Patent No.: US 7,417,513 B2
(45) Date of Patent: Aug. 26, 2008

(54) SYSTEM AND METHOD FOR SIGNAL FILTERING IN A PHASE-LOCKED LOOP SYSTEM (75) Inventors: Walid Khairy Mohamed Ahmed, Tinton Falls, NJ (US); David Bengtson, Easton, PA (US)

(73) Assignee: M/A-COM, Inc., Lowell, MA (US)

( * ) Notice: Subject to any disclaimer, the term of this patent is extended or adjusted under 35 U.S.C. 154(b) by 59 days.

(21) Appl. No.: 11/208,237

(22) Filed: Aug. 17, 2005

(65) Prior Publication Data

US 2007/0040618 A1 Feb. 22, 2007

(51) Int. Cl.
H03C 3/06 (2006.01)
(52) U.S. Cl. .......................................... 332/127; 331/17
(58) Field of Classification Search ................. 332/127; 331/17
See application file for complete search history.

(56) References Cited

U.S. PATENT DOCUMENTS

| 4,352,074 | A | * | 9/1982 | Blinchikoff et al. | 331/17 |
| 5,414,741 | A | * | 5/1995 | Johnson | 375/376 |
| 5,952,895 | A | | 9/1999 | McCune, Jr. et al. | 332/128 |
| 6,094,101 | A | | 7/2000 | Sander et al. | 331/17 |
| 6,140,882 | A | | 10/2000 | Sander | 331/25 |
| 6,208,211 | B1 | * | 3/2001 | Zipper et al. | 331/17 |
| 6,255,912 | B1 | | 7/2001 | Laub et al. | 331/25 |
| 6,611,176 | B1 | | 8/2003 | Goldman | |
| 7,002,417 | B2 | * | 2/2006 | Maunuksela et al. | 331/17 |
| 2003/0031267 | A1 | | 2/2003 | Hietala | 375/295 |
| 2004/0017261 | A1 | | 1/2004 | Soumyanath et al. | |
| 2004/0183602 | A1 | | 9/2004 | Maunuksela et al. | |
| 2005/0129142 | A1 | * | 6/2005 | Yellin et al. | 375/302 |

OTHER PUBLICATIONS

Rhee, Woogeun, "A 1.1-GHz CMOS Fractional-$N$ Frequency Synthesizer with a 3-b Third-Order $\Delta\Sigma$ Modulator," IEEE Journal of Solid-State Circuits, vol. 35, No. 10, Oct. 2000.

* cited by examiner

Primary Examiner—Robert J. Pascal
Assistant Examiner—Levi Gannon (57) ABSTRACT

A system and method for modulating a phase component of an electromagnetic signal includes a phase/frequency detector having first and second inputs and an output. The first phase/frequency detector input may be configured to receive a reference signal. The system may include an oscillator having an input and an output. The oscillator may be configured to generate a desired oscillator output signal at its output. A divider may be configured to receive the oscillator output signal. The divider may have a divider count input and a divider carryout output that may be connected to the second phase/frequency detector input. A loop filter may be connected in series between the phase/frequency detector output and the oscillator input. The loop filter has a transfer function including at least two frequency response rate change points, where each of the frequency rate change points corresponds to a pole or a zero in the transfer function.

21 Claims, 4 Drawing Sheets

SYSTEM AND METHOD FOR SIGNAL FILTERING IN A PHASE-LOCKED LOOP SYSTEM

FIELD OF THE INVENTION

The invention relates generally to methods and apparatus for modulating a phase component of an electromagnetic signal, and more particularly to a loop filter for use in a phase-locked loop system.

BACKGROUND OF THE INVENTION

Electromagnetic waves and signals (hereinafter "signals") are utilized for many different purposes. For example, electromagnetic signals may be processed in order to convey information, such as by attenuating and/or amplifying electromagnetic wave characteristics, for instance, as is seen when modulating the amplitude, frequency or phase of an electrical current or radio frequency (RF) wave to transmit data. As another example, power may be conveyed along a wave in a controlled fashion by attenuating and or amplifying electromagnetic signals, such as is seen when modulating voltage or current in a circuit. Moreover, the uses may be combined, such as when information may be conveyed through a signal by processing power characteristics.

Electromagnetic signal processing may be accomplished through digital or analog techniques. Digital and analog attenuation and/or amplification also may be combined—that is, the same wave form may be subject to various types of digital and/or analog attenuation and/or amplification within a system in order to accomplish desired tasks.

In the processing of electronic signals, phase-locked loop systems, also known as phase-locked loops, may be used for a wide variety of purposes, such as frequency synthesizers and phase modulators in transceivers for wireless communications devices such as GSM (Global System for Mobile communications), PCS (Personal Communication System), PCN (Personal Communications Network), and DECT (Digital Enhanced Cordless Telecommunications) devices. In a typical phase-locked loop ("PLL"), a reference signal at a reference frequency is input to a phase/frequency detector along with a feedback signal derived from the output of the PLL. The output of the frequency/phase detector is filtered by a loop filter and applied to a voltage controlled oscillator to generate an output signal at the desired frequency. The output signal frequency then forms at least part of the feedback signal input to the phase/frequency detector.

A low-pass loop filter may be used in a phase-locked loop to reduce spurious signals near the baseband, as well as noise at higher frequencies. One type of loop filter for use in a phase-locked loop is a second-order or third-order low-pass filter with a single corner frequency and a constant roll-off. However, designing the appropriate filter can be difficult and involve compromise. For instance, if the corner frequency of the loop filter is set low to effectively reduce noise at higher frequencies, then it may undesirably reduce the higher frequencies of the baseband. Similarly, if the corner frequency of the loop filter is set higher to accommodate the entire baseband, then the loop filter may not effectively reduce noise at higher frequencies.

Another difficulty may arise if a phase-locked loop is used in combination with a pre-emphasis filter to provide a combined flat frequency response. If the corner frequency of the loop filter is set low to effectively reduce spurious signals close to the baseband, then it may require an undesirably high gain from the pre-emphasis filter to compensate.

Accordingly, there is a need for methods and systems for filtering electromagnetic signals in a phase-locked loop that effectively reduce both close-in spurious signals and higher-frequency noise signals without unnecessarily reducing the baseband signal or requiring a pre-emphasis filter with an undesirably high gain. There also is a need for signal modulators and transmitters that employ phase-locked loops with such filtering methods and systems.

BRIEF SUMMARY

According to one aspect of the invention, a system for modulating a phase component of an electromagnetic signal includes a phase/frequency detector having first and second inputs and an output. The first phase/frequency detector input is configured to receive a reference signal. The system also includes an oscillator having an input and an output. The oscillator is configured to generate a desired oscillator output signal at its output. A divider is configured to receive the oscillator output signal. The divider has a divider count input and a divider carryout output that is connected to the second phase/frequency detector input. A loop filter is connected in series between the phase/frequency detector output and the oscillator input. The loop filter has a transfer function including at least two frequency response rate change points, where each of the frequency rate change points corresponds to a pole or a zero in the transfer function.

According to another aspect of the invention, there is a method of determining a desired loop filter response for a loop filter in a phase-locked loop. A desired transfer function is determined for the phase-locked loop. A relationship between the desired transfer function and the desired loop filter response is determined based on at least one parameter of the phase-locked loop. The desired loop filter response is calculated based on the desired transfer function and the determined relationship.

According to another aspect of the invention, a method of modulating a phase component of an electromagnetic signal includes generating a phase component signal based on a phase component of the electromagnetic signal. The phase component signal is provided to a loop filter in a phase-locked loop. The loop filter has a transfer function including at least two frequency response rate change points, where each of the frequency response rate change points corresponds to a pole or a zero of the transfer function. The phase component signal is filtered using the loop filter to generate a filtered phase component signal.

Other systems, methods, features and advantages of the invention will be, or will become, apparent to one with skill in the art upon examination of the following figures and detailed description. It is intended that all such additional systems, methods, features and advantages be included within this description.

BRIEF DESCRIPTION OF THE DRAWINGS

The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PRESENTLY PREFERRED EMBODIMENTS

Embodiments of the invention include apparatus, methods and articles of manufacture for processing electromagnetic waves and signals. For illustration purposes, an exemplary embodiment comprises a phase modulator adapted for processing electromagnetic waves and signals. The phase modulator described in this application may be implemented in a wide range of applications, such as, for example, a transmitter, receiver, transducer, etc. For purposes of illustration, an exemplary transmitter, including a phase modulator according to one aspect of the invention, is illustrated in FIG. 1.

Figure 1:
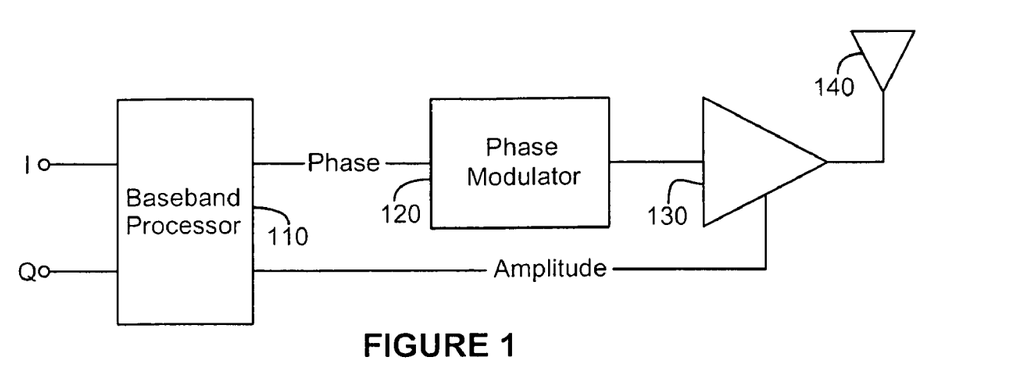
FIG. 1 is a block diagram illustrating a transmitter including a phase modulator according to one aspect of the invention.

One example of a transmitter according to one aspect of the invention is illustrated in FIG. 1. The transmitter 100 includes a baseband processor 110, a phase modulator 120, a power amplifier 130, and an antenna 140. The various components of the exemplary transmitter 100, which are described in more detail below, may be analog or digital in nature. The exemplary transmitter 100 also may include a combination of analog and digital components.

The term "signal," as is used herein, should be broadly construed to include any manner of conveying data from one place to another, such as, for example, an electric current or electromagnetic field, including without limitation, a direct current that is switched on and off or an alternating-current or electromagnetic carrier that contains one or more data streams. Data, for example, may be superimposed on a carrier current or wave by means of modulation, which may be accomplished in analog or digital form. The term "data" as used herein should also be broadly construed to comprise any type of intelligence or other information, such as, for example and without limitation, audio, video, and/or text information.

As illustrated in FIG. 1, the baseband processor 110 may be, for example, a digital signal processor, such as a digital signal processor capable of generating a power control signal and a data control signal in response to the input signal. The input signal, may be, for example, a baseband signal. Electrical power may be regulated by the data control signal in order to generate an output signal for transmission that is an amplified version of the input signal.

The data control signal generated by the baseband processor 110 in this embodiment comprises an electromagnetic wave that contains data derived from the input signal. For example, the baseband processor 110 may convert native baseband I,Q data from the Cartesian domain into the polar domain to create an analog or digital data control signal that contains the amplitude component of the input signal, and an electromagnetic signal that contains the phase component of the input signal. The baseband processor 110 may use a rectangular to polar converter, such as a CORDIC algorithm, to output polar coordinates in the form R, P(sin) and P(cos). The R coordinate represents the amplitude component of the input signal, and the P(sin) and P(cos) coordinates represent the phase component of the signal.

The amplitude and phase components of the input signal are then transmitted through separate paths to power amplifier 130. For example, the amplitude component of the original input signal may be modulated as a series of digital pulses comprising a digital word quantized into bits $B_0$ to $B_{N-1}$ with a most significant bit and a least significant bit. The digital word may be of varying lengths in various embodiments.

The phase component, in turn, is processed separately by phase modulator 120 and then applied to power amplifier 130. For example, the phase component may be modulated by the phase modulator 120 to yield an on-channel, phase modulated carrier. The phase modulated carrier may then be provided to the power amplifier 130. The power amplifier 130 may then combine the phase modulated carrier with the amplitude component to generate a fully-modulated carrier with the required output power signal level.

Figure 2:
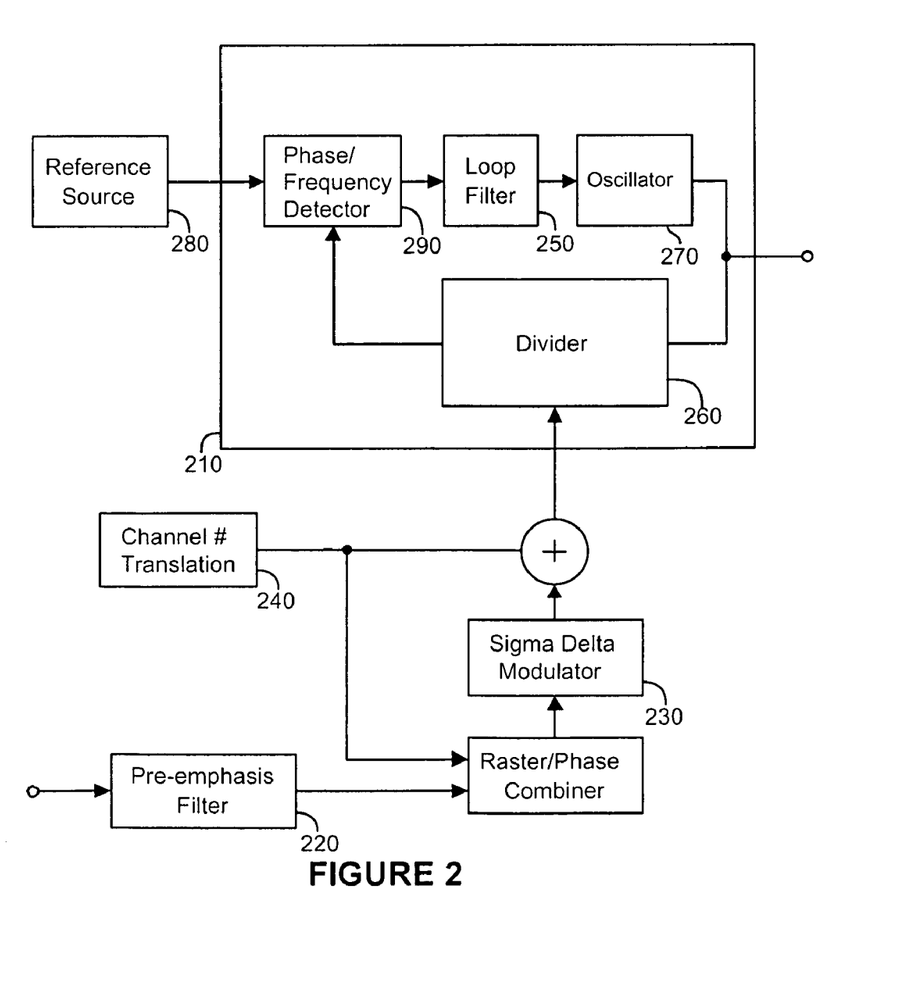
FIG. 2 is a block diagram illustrating a phase modulator including a phase-locked loop according to another aspect of the invention.

One exemplary manner for processing the phase component of the input signal is illustrated in FIG. 2, which is a block diagram illustrating a phase modulator 120 including a phase-locked loop 210 according to another aspect of the invention. The phase modulator 120 receives the phase component signal from the baseband processor and may pass the signal through a pre-emphasis filter 220.

Figure 3:
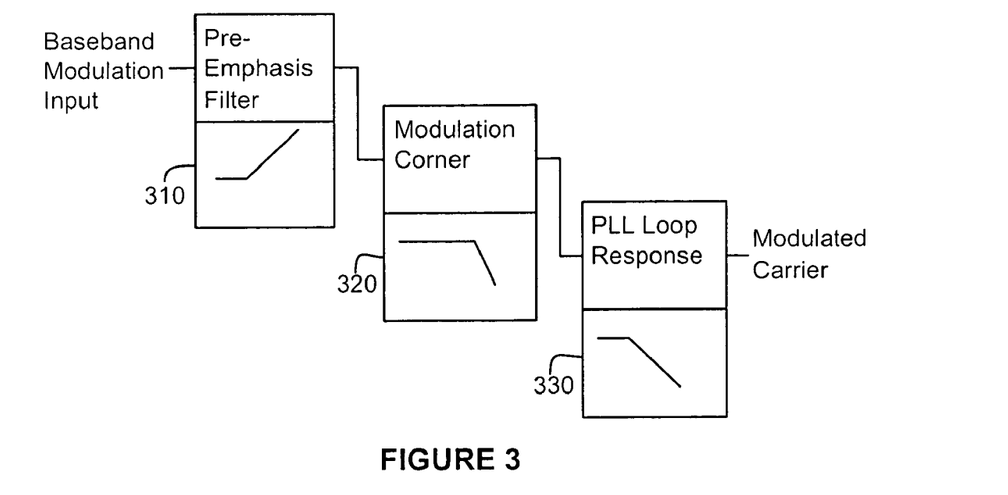
FIG. 3 is a block diagram illustrating the frequency responses provided by components of a phase modulator including a phase-locked loop according to another aspect of the invention.

The pre-emphasis filter 220 may be calculated to have a magnitude and phase response that is the inverse of the closed loop response of the phase-locked loop 210 and the sigma delta modulator 230. For example, FIG. 3 illustrates an example of a frequency response 310 for the pre-emphasis filter that is the inverse of the frequency response 330 of the loop filter 250 of the phase-locked loop 210. As will be discussed below, in some instances, the phase-locked loop 210 and sigma delta modulator 230 have an inherent design bandwidth to minimize noise in the signal. Limiting of the bandwidth in this manner, however, may cause a roll-off (i.e., a diminution) of the higher frequency components of the signal. The pre-emphasis filter 220 compensates for roll-off by increasing the gain of these higher frequency components, thus producing a more even (e.g., flattened) overall frequency response and effectively extending the modulation bandwidth of the phase modulator 120. The pre-emphasis filter 220 may be implemented digitally, using a digital signal processor, although it is not limited thereto. For example, the pre-emphasis filter 220 may be a FIR (finite impulse response) filter or an IIR (infinite impulse response) filter. The pre-emphasis filter 220 also may be calculated to set the overall passband response of phase modulator 120 (e.g., 4 MHz).

The phase modulator 120 is configured to modulate the phase component of the input signal onto a carrier wave with a selected center frequency. For example, the center frequency about which a given signal is to be modulated may be determined by a channel calculation, by which the carrier wave frequency (e.g., 1880 MHz) is divided by the frequency of the reference source to establish a channel for the signal.

One type of channel calculation may yield a number that has an integer part and a fractional part. For example, channel calculator 240 may receive a channel number from baseband processor 110 and determine a selectable non-whole number by which the carrier wave of the phase modulator 120 is to be divided. This enables the selection of a channel on which the phase data signal is to be modulated. As an illustration of the channel calculation procedure, assuming a carrier wave frequency of 1880 MHz as an example, this number may be represented as 23.5 to 24.5 in relation to the reference frequency. The fractional portion of this number may then be combined with the data signal, which may be passed to the sigma delta modulator 230 in the phase modulator 120. The sigma delta modulator 230 may be used in connection with phase-locked loop 210 to achieve wideband modulation of the input signal phase component onto a carrier wave. Sigma delta modulator 230 serves to randomize and oversample the input signal phase component, with the average over multiple samples of the output being equal to the input. The sigma delta modulator 230 may frequency-shape the inherent quantization noise from the digitizing process so that at the desired frequencies, the quantization noise is low.

Sigma delta modulator 230 may include, for example, a series of adders/accumulators and feedback components for inputting the fractional phase/channel number data (which may be an analog or digital signal) and outputting a digitized series of integers that equal the fractional input. The sigma delta modulator 230 may be configured such that the input range is sufficient for phase modulation data as well as the fractional portion of the channel number. For example, sigma delta modulator 230 may be a three-bit system, which is capable of producing eight different output numbers (e.g., −3, −2, −1, 0, 1, 2, 3, and 4). It should be understood, however, that sigma delta modulator 230 may include any desired number of bits or elements. The sigma delta modulator 230 may produce four output integers for each sample of the input, yielding an oversampling rate of four times the input. Sampling of the input modulating data in sigma delta modulator 230 in this manner may introduce noise on the input modulating signal. Any such noise may be filtered by the loop filter 250 in the phase-locked loop 210.

The output of sigma delta modulator 230 is combined with the integer portion of the channel number received from channel calculator 240. For example, the combination may produce a number between 20 and 28. The combination of the fractional and integer portions of the channel number may be provided to divider 260 and used to lock the phase-locked loop 210 to the desired RF carrier.

The phase-locked loop 210 is used to modulate a signal synthesized by an RF carrier wave signal source, such as carrier wave source 270, using the phase component of the input signal. Carrier wave source 270 may be any source of electromagnetic waves that is capable of producing a carrier wave, such as a radio frequency voltage-controlled oscillator (VCO).

The frequency of reference source 280 (or a division thereof by some number) is compared with the output frequency of carrier wave source 270, divided by a series of numbers received by divider 260 from sigma delta modulator 230 and channel calculator 240. Reference source 280 may, for example, include a voltage-controlled oscillator of a constant or substantially constant frequency or may be derived from a source at another frequency.

Phase/frequency detector 290 is used to compare the relative phases of the two signals and output a signal that is proportional to the difference (phase shift) between them. This output signal may be utilized to adjust the frequency of carrier wave source 270 so that the phase difference measured at the phase-frequency detector 290 is substantially close and preferably equal to zero. Hence, the phase of the signal output by the phase modulator 120 may be locked by the feedback loop of the phase-locked loop 210 to prevent undesired drift of the signal phase due to variations (e.g., distortion) in the phase and frequency of the carrier wave source 270.

As illustrated in FIG. 2, the feedback signal from carrier wave source 270 may be passed through divider 260, with the division ratio of the divider controlled by the series of numbers representing the phase component information received from the sigma delta modulator 230 and the channel information received from channel calculator 240. The resulting signal may be passed to the phase/frequency detector 290, where it is compared with the signal from reference source 280, as noted above. This combined signal may be passed through the loop filter 250 and combined with the carrier wave signal generated by carrier wave source 270.

One type of loop filter for use in a phase-locked loop is a low-pass filter with a single corner frequency and a constant roll-off. For example, FIG. 3 illustrates the frequency response, or transfer function, 330 of one such loop filter. However, as noted above, if the corner frequency of the loop filter is set relatively low to effectively reduce noise at higher frequencies, then it may undesirably reduce the higher frequencies of the baseband. Similarly, if the corner frequency of the loop filter is set higher to accommodate the entire baseband, then the loop filter may not effectively reduce spurious components at frequencies close to the baseband. In addition, to improve loop stability, the transfer function 330 of the loop filter preferably is of a lower order than the overall phase modulation frequency response 320.

A loop filter transfer function with multiple poles and/or zeros may balance these competing interests. Each pole and each zero in the loop filter transfer function produces a rate change point in the frequency response of the loop filter. An example of a loop filter having a transfer function with multiple poles and/or zeros is a cascade of two component filters with different corner frequencies. Each component filter contributes one pole or zero to the overall loop filter transfer function. One component filter may provide suppression of spurious signals at frequencies that are close to the baseband. This filter may be of a low order to minimize any effects on loop stability. A second component filter may provide a higher corner frequency, which may be higher than the modulation bandwidth of the system. In this way, the second filter may effectively reduce noise above the baseband without undesirable effects on the baseband modulation response of the system.

Figure 4:
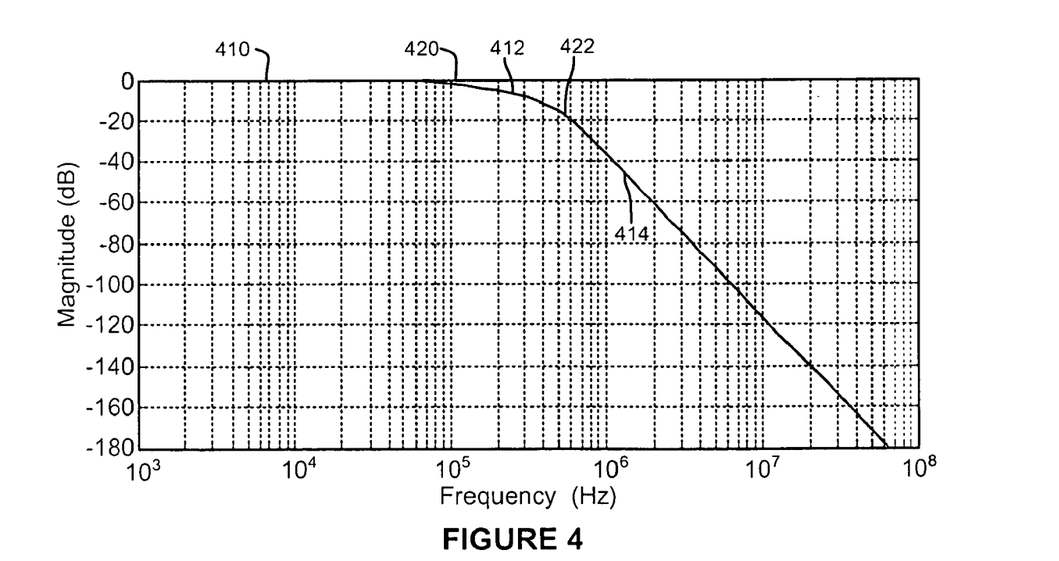
FIG. 4 is a plot illustrating a cascaded loop filter frequency response according to another aspect of the invention.

FIG. 4 is a plot illustrating the transfer function of a cascaded loop filter according to another aspect of the invention. The transfer function is for a loop filter 250 having two cascaded filter components. The resulting transfer function includes three separate characteristic transfer function zones 410, 412, and 414, separated by two frequency response rate change points 420 and 422. The two frequency response rate change points 420 and 422 correspond to two poles in the loop filter transfer function. These two rate change points 420 and 422, and the resulting characteristic zones 410, 412, and 414 of the loop filter transfer function provide different frequency response characteristics in each of the zones and effectively balance the competing concerns of noise reduction, loop stability, and consistent baseband response described above.

Each of the two cascaded filter components corresponding to the loop filter transfer function illustrated in FIG. 4 has a pole at a particular frequency, which results in the two frequency response rate change points 420 and 422. In this example, the frequency response rate change points 420 and 422 serve as separate corner frequencies in the combined loop filter. For example, the first filter component is of a relatively low order and has a corner frequency at approximately 100 kHz. The relatively low order of the first filter component provides a shallow slope in the frequency response in the middle characteristic zone 412 and minimizes any effects on loop stability. The pole in the transfer function of the first component filter produces the first frequency response rate change point 420 at approximately 100 kHz in the loop filter transfer function. Thus, this filter component suppresses spurious signals at frequencies that are close to the baseband. The second filter component is of a relatively higher order and has a higher corner frequency at approximately 500 kHz. The higher order of the second filter component provides a steeper slope in the frequency response in the higher characteristic zone 414. The pole in the transfer function of the second component filter produces the second frequency response rate change point 422 at approximately 500 kHz. This filter component may effectively reduce noise at frequencies well above the baseband. Because the second rate change point 422 in the loop filter transfer function is relatively high compared to the baseband frequencies, the second filter component minimizes undesirable effects on the baseband modulation response of the system.

Figure 5:
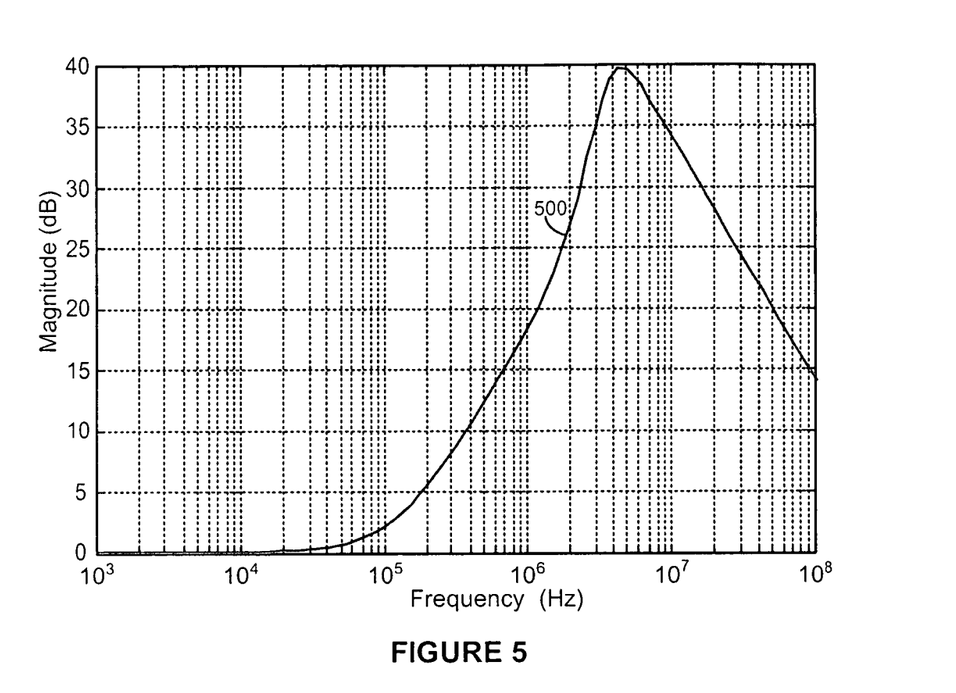
FIG. 5 is a plot illustrating a frequency response of a pre-emphasis filter for use with a phase-locked loop according to one aspect of the invention.
Figure 6:
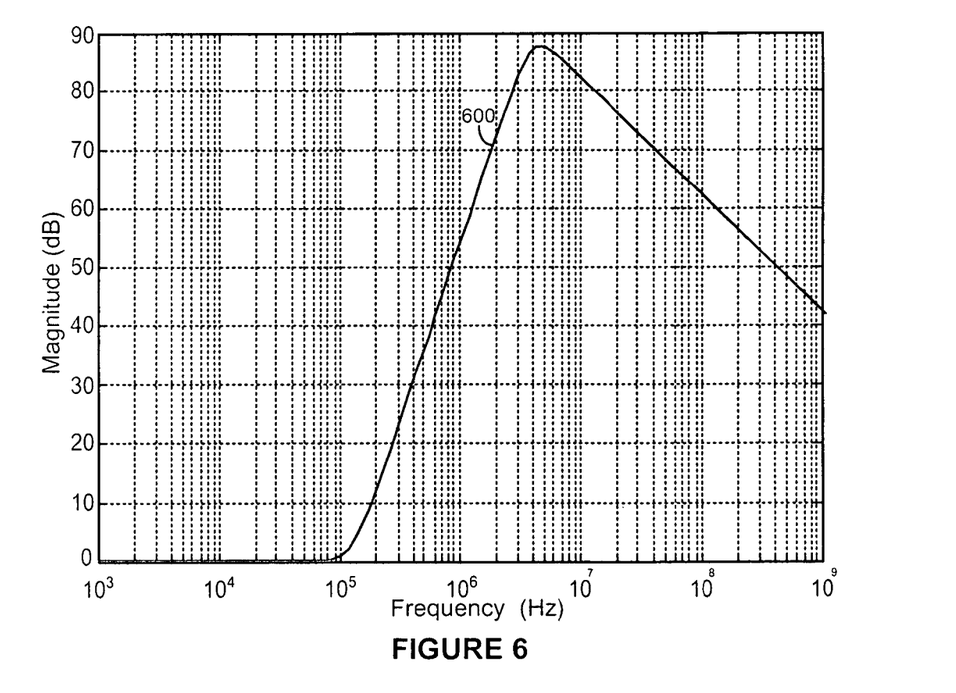
FIG. 6 is a plot illustrative a frequency response of a pre-emphasis filter for use with a phase-locked loop employing a low-pass loop filter with a single corner frequency.

A loop filter transfer function having multiple poles and/or zeros, such as the transfer function illustrated in FIG. 4, may provide an additional benefit by reducing the necessary gain in the frequency response of the pre-emphasis filter. As described above with respect to FIG. 3, the frequency response 310 of the pre-emphasis filter 220 may be designed to be the inverse of the loop filter transfer function 330, thereby providing a more even overall frequency response. Because a loop filter having multiple transfer function poles and/or zeros, such as the one described above, may provide a smaller roll-off near the baseband, the gain of the pre-emphasis filter may be reduced accordingly. For example, FIG. 5 illustrates the frequency response 500 of a pre-emphasis filter for use with a loop filter having multiple transfer function poles or zeros according to one aspect of the invention. The peak gain of the pre-emphasis filter response 500 shown in FIG. 5 is approximately 40 dB. By contrast, FIG. 6 illustrates the frequency response 600 of a pre-emphasis filter for use with a low-pass loop filter having a single corner frequency and, therefore, a single pole or zero. The peak gain of the frequency response 600 shown in FIG. 6 is approximately 85-90 dB. Because loop filter transfer function with multiple poles and/or zeros may provide a more gradual roll-off in the loop filter frequency response near the baseband, it permits a smaller gain in the pre-emphasis filter 220.

A loop filter 250 according to the invention may include any number of desired filter components and transfer function poles and/or zeros. Thus, the frequency response of the loop filter 250 may be tailored to work with various types of phase modulators and phase-locked loops. For example, the design of the loop filter 250 may take into account various parameters of the phase-locked loop, such as the sensitivity of the oscillator to temperature and/or frequency, the ratio of the divider, characteristics of the phase/frequency detector, requirements for phase noise, etc. In addition, the loop filter 250 may be implemented using either analog or digital components. For example, the loop filter 250 may be implemented as a ladder network of resistors and capacitors. Alternatively, the loop filter 250 may be implemented as an integrated circuit. The loop filter 250 also may be implemented using digital signal processing techniques. If digital components are used, it may be necessary to convert signals from analog to digital or vice versa by providing one or more analog-to-digital converters and/or digital-to-analog converters.

Returning now to FIG. 1, the processed wave output from phase modulator 120 may have a constant envelope (i.e., it may have no amplitude variations), yet it represents the phase component of the original input wave. This output wave may then be sent where desired, such as to power amplifier 130, which may include any of a variety of suitable types of amplifier components. For example, power amplifier 130 may be adapted to act as a current source when it is appropriately regulated by the digital word output from the amplitude component of the input signal. The amplitude portion of the input signal may be passed separately from the baseband processor 110 to the power amplifier 130 and may be used to actuate individual segments within the power amplifier 130, to amplify or attenuate the phase modulated carrier signal in relation to the original input signal. This may produce a combined output current from power amplifier 130 that represents an amplified or attenuated carrier wave containing the information from the input signal. One such amplifier is described in U.S. patent application Ser. No. 10/294,430, the disclosure of which is incorporated herein by reference.

With certain transmitters, receivers, and transceivers, components such as the phase modulator 120 may be specialized for particular input signals, carrier waves, and output signals (e.g., various types of cell phones, such as CDMA, CDMA2000, WCDMA, GSM, TDMA), as well as various other types of devices, both wired and wireless (e.g., Bluetooth, 802.11a, -b, -g, radar, 1xRTT, radios, GPRS, computers, computer or non-computer communication devices, or handheld devices). The modulation schemes used in these environments may include, for example, GMSK, which is used in GSM; GFSK, which is used in DECT & Bluetooth; 8-PSK, which is used in EDGE; OQPSK & HPSK, which are used in IS-2000; p/4 DQPSK, which is used in TDMA; and OFDM, which is used in 802.11.

Figure 7:
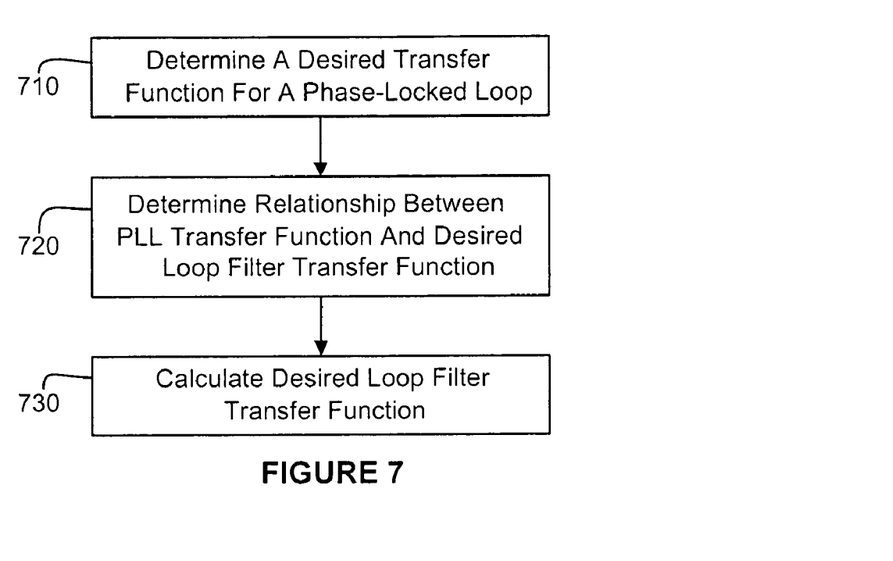
FIG. 7 is a flow diagram illustrating a method of designing a loop filter according to another aspect of the invention.

FIG. 7 is a flow diagram illustrating a method of designing a loop filter according to another aspect of the invention. A desired transfer function is determined for a phase-locked loop, as illustrated by block 710. A relationship is determined between the phase-locked loop transfer function and a desired transfer function for the loop filter 250, as illustrated by block 720. For example, the relationship may be based on various parameters of the phase-locked loop, such as the sensitivity of the oscillator to temperature and/or frequency, the ratio of the divider, characteristics of the phase/frequency detector, requirements for phase noise, etc. The desired loop frequency response is then calculated based on the determined relationship and any necessary or desired parameters, as illustrated by block 730. For example, the calculation may be based on a formula such as $$H(f)=G^{-1}(f)*P(f),$$

where H(f) represents the cascaded loop filter frequency response, P(f) represents the overall desired phase-locked loop transfer function, and G(f) represents the phase-locked loop frequency response.

Figure 8:
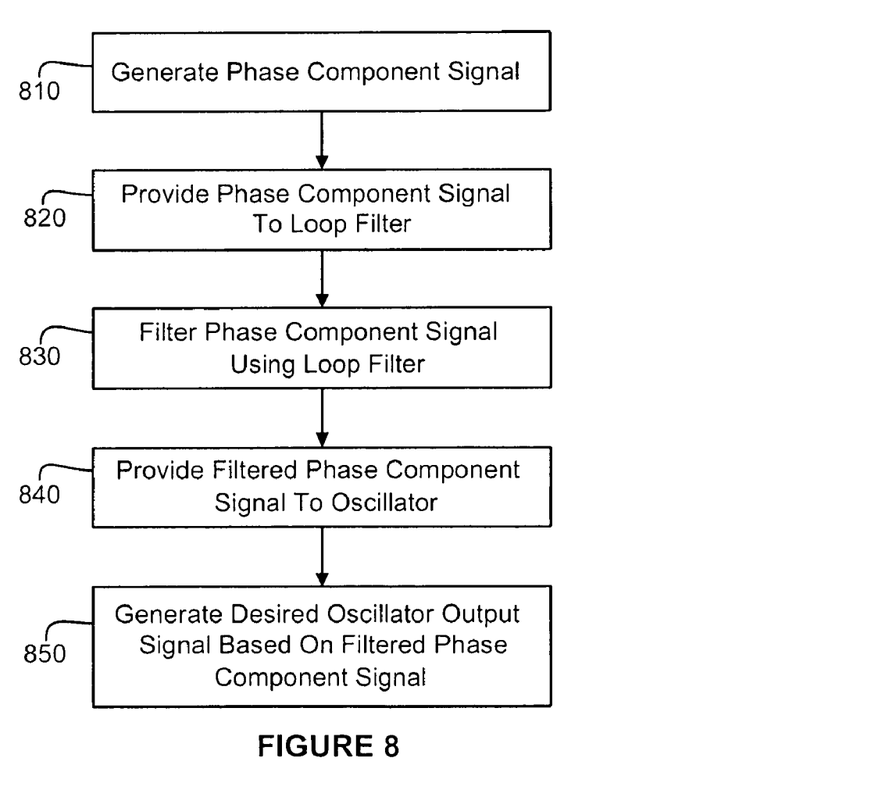
FIG. 8 is a flow diagram illustrating a method of modulating a phase component of an electromagnetic signal according to another aspect of the invention.

FIG. 8 is a flow diagram illustrating a method of modulating a phase component of an electromagnetic signal according to another aspect of the invention. A phase component signal is generated based on a phase component of an electromagnetic signal, as illustrated by block 810. For example, the phase component signal may be generated by the phase/frequency detector 290, as shown in FIG. 2. The phase component signal is provided to a loop filter 250, as illustrated by block 820. The transfer function of the loop filter includes multiple characteristic frequency response zones, separated by at least two poles and/or zeros, and may be designed to provide any desired loop filter frequency response, as described above. The phase component signal is filtered using the loop filter 250, as illustrated by block 830. The filtered phase component signal may then be provided to an oscillator, as illustrated by block 840. For example, the oscillator may be a voltage controlled oscillator 270, as shown in FIG. 2. A desired oscillator output signal may then be generated based on the filtered phase component signal, as illustrated by block 850. The oscillator output signal may, for example, be provided to an amplifier, such as the power amplifier 130 shown in FIG. 1.

It is intended that the foregoing detailed description be regarded as illustrative rather than limiting, and that it be understood that the following claims, including all equivalents, are intended to define the scope of this invention.

the invention claimed is:

1. A system for modulating a phase component of an electromagnetic signal, comprising:
    a phase/frequency detector having a first phase/frequency detector input, a second phase/frequency detector input, and a phase/frequency detector output, the first phase/frequency detector input being configured to receive a reference signal;
    an oscillator having an oscillator input and an oscillator output, where the oscillator is configured to generate a desired oscillator output signal at the oscillator output;
    a divider configured to receive the oscillator output signal, where the divider has a divider count input and a divider carryout output, and where the divider carryout output is connected to the second phase/frequency detector input;
    a loop filter connected in series between the phase/frequency detector output and the oscillator input, where the loop filter has a transfer function including a frequency corresponding to a substantially maximum magnitude of the transfer function, a first frequency response rate change point, and a second frequency response rate change point, the first frequency response rate change point being between the frequency corresponding to the substantially maximum magnitude of the transfer function and the second frequency response rate change point;
    where the first frequency response rate change point and the second frequency response rate change point each correspond to a pole or a zero in the transfer function, and where the first frequency response rate change point corresponds to an initial roll-off from the frequency corresponding to the substantially maximum magnitude of the transfer function, the initial roll-off having a first slope, and the second frequency response rate change point corresponds to a secondary roll-off, the secondary roll-off having a second slope steeper than the first slope; and
    a pre-emphasis filter in communication with the divider and configured to compensate for the initial roll-off in the transfer function of the loop filter, the pre-emphasis filter having a substantially maximum gain of about at most 40 dB.

2. A system for modulating a phase component of an electromagnetic signal as in claim 1, wherein the loop filter transfer function includes two poles.

3. A system for modulating a phase component of an electromagnetic signal as in claim 1, wherein the loop filter transfer function includes two zeros.

4. A system for modulating a phase component of an electromagnetic signal as in claim 1, wherein the loop filter transfer function includes one pole and one zero.

5. A system for modulating a phase component of an electromagnetic signal as in claim 1, further comprising:
    a sigma delta modulator in communication with the divider and configured to generate a digital signal representative of a phase component of the electromagnetic signal, where the digital signal is frequency-shaped to reduce quantization noise below a desired frequency.

6. A system for modulating a phase component of an electromagnetic signal as in claim 5,
    where the pre-emphasis filter is in communication with the sigma delta modulator.

7. A system for modulating a phase component of an electromagnetic signal as in claim 1, further comprising:
    a segmented power amplifier in communication with the oscillator and including a plurality of power amplifier segments, where each power amplifier segment is configured to generate an amplified signal based on the oscillator output signal.

8. A system for modulating a phase component of an electromagnetic signal as in claim 1, where the oscillator output signal has a substantially constant envelope.

9. A system for modulating a phase component of an electromagnetic signal as in claim 1, wherein the first frequency response rate change point is at about 100 kHz, and the second frequency response rate change point is at about 500 kHz.

10. A system for modulating a phase component of an electromagnetic signal as in claim 1, wherein the frequency corresponding to the substantially maximum magnitude of the transfer function comprises a baseband frequency.

11. A method of determining a desired loop filter response for a loop filter in a phase-locked loop having a plurality of parameters, the method comprising:
    determining a desired phase-locked loop transfer function for the phase-locked loop;
    determining a relationship between the desired phase-locked loop transfer function and a desired loop filter transfer function based on at least one parameter of the phase-locked loop; and
    calculating the desired loop filter transfer function based on the desired phase-locked loop transfer function and the determined relationship, where the desired loop filter transfer function includes a frequency corresponding to a substantially maximum magnitude of the transfer function, a first frequency response rate change point, and a second frequency response rate change point, the first frequency response rate change point being between the frequency corresponding to the substantially maximum magnitude of the transfer function and the second frequency response rate change point, where the first frequency response rate change point and the second frequency response rate change point each correspond to a pole or a zero in the transfer function and where the first frequency response rate change point corresponds to an initial roll-off from the frequency corresponding to the substantially maximum magnitude of the transfer function, the initial roll-off having a first slope, and the second frequency response rate change point corresponds to a secondary roll-off after the first roll-off, the secondary roll-off having a second slope steeper than the first slope;
    where the desired loop filter transfer function is compatible with a reduced pre-emphasis filter gain of about at most 40 dB.

12. A method of determining a desired loop filter response as in claim 11, where the loop filter transfer function includes two poles.

13. A method of determining a desired loop filter response as in claim 11, where the loop filter transfer function includes two zeros.

14. A method of determining a desired loop filter response as in claim 11, where the desired loop filter transfer function includes at least two of a pole and/or a zero.

15. A method of determining a desired loop filter response as in claim 11, where the at least one parameter of the phase-locked loop includes a parameter selected from the group consisting of: a sensitivity of the oscillator to temperature, a sensitivity of the oscillator to frequency, a ratio of the divider, a characteristic of the phase/frequency detector, and a phase noise requirement.

16. A method of modulating a phase component of an electromagnetic signal, comprising:

generating a phase component signal based on a phase component of the electromagnetic signal;

providing the phase component signal to a loop filter in a phase-locked loop, where the loop filter has a transfer function including a frequency corresponding to a substantially maximum magnitude of the transfer function, a first frequency response rate change point and a second frequency response rate change point, the first frequency response rate change point being between the frequency corresponding to the substantially maximum magnitude of the transfer function and the second frequency response rate change point, where the first frequency response rate change point and the second frequency response rate change point each correspond to a pole or a zero of the transfer function, and where the first frequency response rate change point corresponds to an initial roll-off from the frequency corresponding to the substantially maximum magnitude of the transfer function, the initial roll-off having a first slope, and the second frequency response rate change point corresponds to a secondary roll-off after the first roll-off, the secondary roll-off having a second slope steeper than the first slope;

filtering the phase component signal using the loop filter to generate a filtered phase component; and compensating for the initial roll-off with a pre-emphasis filter having a substantially maximum gain of about at most 40 dB.

17. A method of modulating a phase component of an electromagnetic signal as in claim 16, wherein the loop filter transfer function includes two poles.

18. A method of modulating a phase component of an electromagnetic signal as in claim 16, wherein the loop filter transfer function includes two zeros.

19. A method of modulating a phase component of an electromagnetic signal as in claim 16, wherein the loop filter transfer function includes one pole and one zero.

20. A method of modulating a phase component of an electromagnetic signal as in claim 16, further comprising:

providing the filtered phase component signal to an oscillator; and generating a desired oscillator output signal based on the filtered phase component signal.

21. A method of modulating a phase component of an electromagnetic signal as in claim 20, further comprising:

providing the oscillator output signal to a segmented power amplifier having a plurality of amplifier segments; and activating each of amplifier segments in accordance with a control signal based on an amplitude component of the electromagnetic signal to generate an amplified signal based on the oscillator output signal.

* * * * *